United States Patent
Randall

(10) Patent No.: US 7,211,740 B1
(45) Date of Patent: May 1, 2007

(54) VALVE METAL ELECTROMAGNETIC INTERFERENCE FILTER

(75) Inventor: Michael S. Randall, Simpsonville, SC (US)

(73) Assignee: Kemet Electronics Corporation, Greenville, SC (US)

( * ) Notice: Subject to any disclaimer, the term of this patent is extended or adjusted under 35 U.S.C. 154(b) by 0 days.

(21) Appl. No.: 11/414,394

(22) Filed: Apr. 28, 2006

(51) Int. Cl.
H01R 13/648 (2006.01)

(52) U.S. Cl. .................. 174/359; 174/520; 333/202; 333/12; 336/84 R; 361/811

(58) Field of Classification Search ............ 174/359, 174/520; 333/202, 12; 336/84 R; 361/811
See application file for complete search history.

(56) References Cited

U.S. PATENT DOCUMENTS

| | | | |
|---|---|---|---|
| 6,046,898 A | 4/2000 | Seymour et al. | 361/113 |
| 6,388,863 B1 | 5/2002 | Horie | 361/303 |
| 6,707,687 B2 * | 3/2004 | Kogasaka et al. | 361/800 |
| 6,721,171 B2 | 4/2004 | Masuda et al. | 361/523 |
| 6,790,379 B2 | 9/2004 | Aoki et al. | 252/62.64 |
| 6,873,518 B2 | 3/2005 | Masuda et al. | 361/525 |
| 6,882,547 B2 * | 4/2005 | Arz | 361/816 |
| 2004/0021534 A1 | 2/2004 | Arai et al. | 333/204 |
| 2004/0084199 A1 * | 5/2004 | Chereson | 174/35 R |

FOREIGN PATENT DOCUMENTS

JP 2001185423 7/2001

* cited by examiner

Primary Examiner—Hung V. Ngo
(74) Attorney, Agent, or Firm—Joseph T. Guy; Nexsen Pruet, LLC

(57) ABSTRACT

A valve metal electromagnetic interference filter (VMEIF). The filter comprises a porous valve metal pellet with at least three terminals extending therefrom. A dielectric layer at least partially circumvents the sintered porous valve metal pellet. A conductive layer at least partially circumvents the dielectric layer. A primary termination pad is in electrical contact with each lead. An inductor is in electrical contact with at least one lead between the sintered porous valve metal pellet and the primary termination pad. A secondary termination pad is in electrical contact with the conductive layer and a casing encloses at least one electromagnetic interference filter element except for a portion of the primary termination pads and the secondary termination pad. The VMEIF may be combined into either a multi-element electromagnetic interference filter or into a multiple input/output modular structure, as well as embedded within electrical circuitry.

37 Claims, 2 Drawing Sheets

VALVE METAL ELECTROMAGNETIC INTERFERENCE FILTER

BACKGROUND

The present application is related to interference filters and particularly interference filters incorporating porous valve metals in their construction.

Interference filters, and their use, are well known throughout the electronics industry. In general, interference filters comprise a capacitive component and an inductive component. In the case of a low pass filter, the low frequency resistance through the capacitive component exceeds the low frequency resistance through the inductive component and the signal passes through the inductive component. As the frequency increases the resistance through the inductive component exceeds the resistance through the capacitor and the high frequency signal passes through the capacitive component to ground.

Exemplary devices are described, for example, in U.S. Pat. No. 6,873,518. These devices are limited in their ability to accurately control the onset frequency and they require a large footprint on the circuit board which has become a serious detriment in modern circuitry.

While the devices of the prior art are beneficial there is an ongoing desire to improve the electrical characteristics associated with interference filters while, at the same time, providing a device which is surface mountable thereby minimizing the footprint required for the passive device. Filters meeting these requirements were previously unavailable and are now provided in the instant invention.

SUMMARY

It is an object of the present invention to provide an improved interference filter.

It is a further object of the present invention to provide an improved interference filter which can be manufactured with accurate tolerances with regard to onset frequency and which can be surface mounted thereby decreasing the footprint on a printed circuit.

These and other advantages, as will be realized, are provided in an electromagnetic interference filter. The filter has a sintered porous valve metal pellet with at least two leads extending therefrom. A dielectric layer at least partially circumvents the sintered porous valve metal pellet. A conductive layer at least partially circumvents the dielectric layer. A primary termination pad is in electrical contact with each lead. An inductor is in electrical contact with at least one lead between the sintered porous valve metal pellet and the primary termination pad. A secondary termination pad is in electrical contact with the conductive layer and a casing encloses the electromagnetic interference filter except for a portion of the termination pad and the secondary termination pad.

Yet another embodiment is provided in an electromagnetic interference filter. The filter has a first sintered porous valve metal pellet with at least one first primary lead extending therefrom. A first dielectric layer at least partially circumvents the first sintered porous valve metal pellet. A first conductive layer at least partially circumvents the first dielectric layer. A first primary termination pad is in electrical contact with the first primary lead. A first secondary termination pad is in electrical contact with the first conductive layer. A second sintered porous valve metal pellet has at least one second primary lead extending therefrom. A second dielectric layer at least partially circumvents the second sintered porous valve metal pellet. A second conductive layer at least partially circumvents the second dielectric layer. A second primary termination pad is in electrical contact with the second primary lead. A second secondary termination pad is in electrical contact with the second conductive layer. The first sintered valve metal pellet and second sintered valve metal pellet are in electrical contact and a casing encloses the electromagnetic interference filter except for a portion of the first primary termination pad the second primary termination pad and the secondary termination pad.

DETAILED DESCRIPTION OF THE INVENTION

The invention will be described with reference to the various figures forming an integral part of the present application. In the various figures similar elements will be numbered accordingly.

Figure 1:
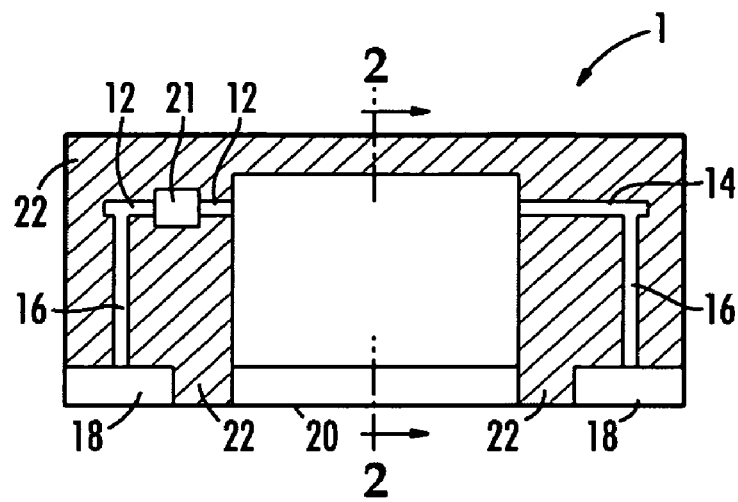
FIG. 1 is a partial cross-sectional view of an embodiment of the present invention.

An embodiment of the present invention is illustrated in partial cross-sectional view in FIG. 1. In FIG. 1, the valve metal electromagnetic interference filter (VMEIF) is generally represented at 1. The VMEIF comprises a porous sintered anode core, 10, with leads, 12 and 14 extending there from. At least one lead, 12 in FIG. 1, comprises an inductor, 21, integral thereto. A secondary pad, 20, separated from the anode by a dielectric (not shown) allows higher frequency current to pass to ground at frequencies starting above the onset frequency. Each lead, 12 and 14, is connected to a primary pad, 18, by a riser, 16. The entire assembly except for the lower termination of the secondary pad and primary pads is encased in a non-conducting protective material, 22.

Figure 2:
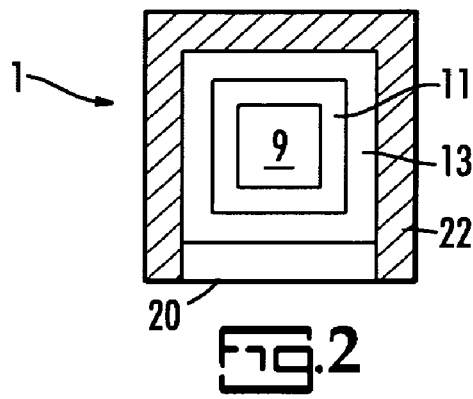
FIG. 2 is a cross-sectional view taken along line 1—1 of FIG. 1.

FIG. 2 is a cross-sectional view of the embodiment of FIG. 1 taken along line 2—2 of FIG. 1. In FIG. 2, a porous sintered valve metal pellet, 9, is partially circumvented by a dielectric layer, 11. The dielectric layer is preferably, but not limited to, an oxide of the valve metal. A cathodic layer, 13, partially circumvents the dielectric layer with the pellet, dielectric and cathodic layer taken together to form the porous sintered anode core, 10, of FIG. 1. The secondary pad, 20, is in electrical contact with the cathodic layer. Additional adhesive layers may be necessary, particularly, between the cathodic layer and secondary pad. In use, current with a frequency below the onset frequency will pass preferably from an input primary lead through the sintered valve metal and then through the output primary lead. Current with a frequency above the onset frequency will pass preferably from the input primary lead through the sintered valve metal then through the secondary lead.

Figure 3:
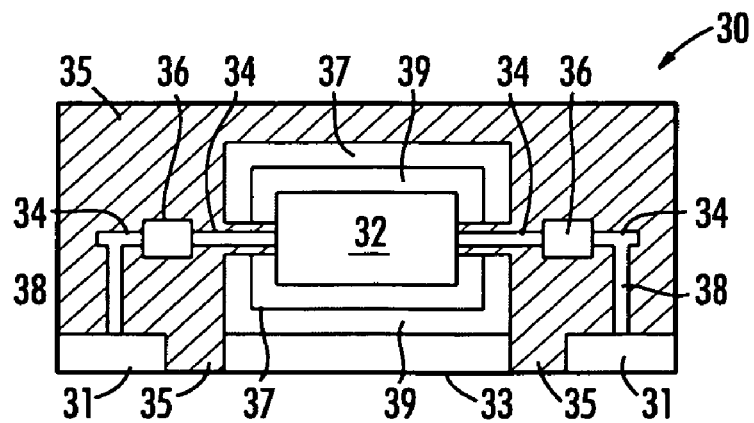
FIG. 3 is a partial cross-sectional view of an embodiment of the present invention.

Another embodiment is illustrated in cross-sectional view in FIG. 3. In FIG. 3, the VMEIF, generally represented at 30, comprises a porous sintered valve metal pellet, 32. Partially circumventing the pellet is a dielectric layer, 37. A cathodic layer, 39, partially circumvents the dielectric layer, 37. A secondary pad, 33, in electrical contact with the cathodic layer allows current with a frequency above the onset frequency to pass to ground. Extending from the pellet, 32, are leads, 34, which are embedded in the pellet but which are not in physical contact with each other. It is preferable that the leads are pressed into the pellet during the formation of the pellet. At least one lead preferably has an inductor, 36, integral thereto. Each lead is in electrical contact with an anode primary terminal, 31, through a riser, 38. The entire assembly except for the lower termination of the primary pads and the secondary pad is encased in a non-conducting protective material, 35.

Figure 4:
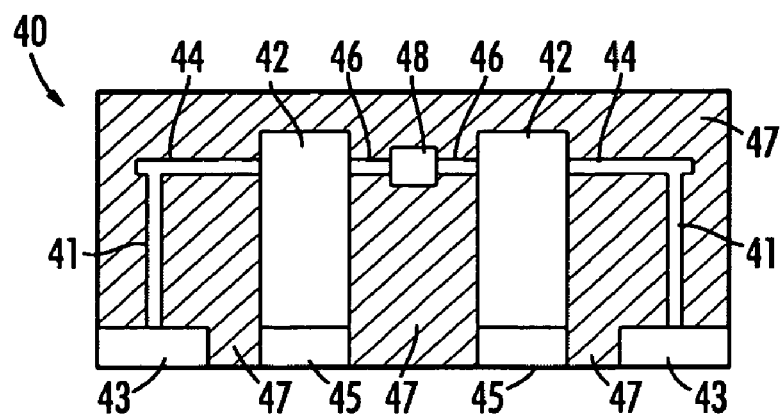
FIG. 4 is a partial cross-sectional view of an embodiment of the present invention.

Another embodiment is illustrated in partial cross-sectional view in FIG. 4. In FIG. 4, the VMEIF is generally represented at 40. The VMEIF comprises a pair of porous sintered anode cores, 42, with a lead, 46, there between preferably connected through an inductor, 48. Each core has associated therewith a secondary pad, 45, for passing high frequency current to ground. Leads, 44, extending from each core are in electrical contact with primary pads, 43, through risers, 41. The entire assembly except for the lower termination of the primary pads and secondary pads is encased in a non-conducting protective material, 47. At least one of the leads, 44, may have an inductor integral thereto.

Figure 5:
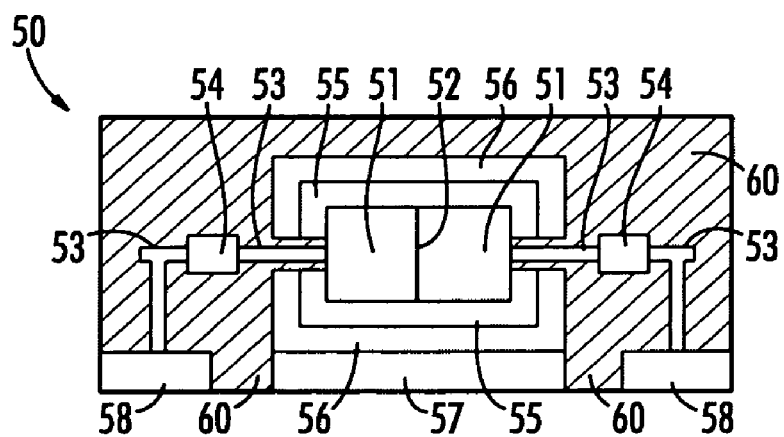
FIG. 5 is a partial cross-sectional view of an embodiment of the present invention.

Another embodiment of the present invention is illustrated in cross-sectional view in FIG. 5. In FIG. 5 the VMEIF, is generally represented at 50. Two pre-formed anode pellets, 51, are fused at an interface, 52, by an electrically conducting paste. Each pellet comprises a lead, 53, and it is preferred that at least one lead have an inductor, 54, integral thereto. A dielectric layer, 55, and cathodic layer, 56, circumvent the joined pellets. A secondary pad, 57, is in electrical contact with the cathodic layer and the leads are in contact with primary pads, 58, through risers, 59. The entire assembly except for the lower portions of the primary pads and secondary pad is incased in a non-conductive material, 60.

Figure 6:
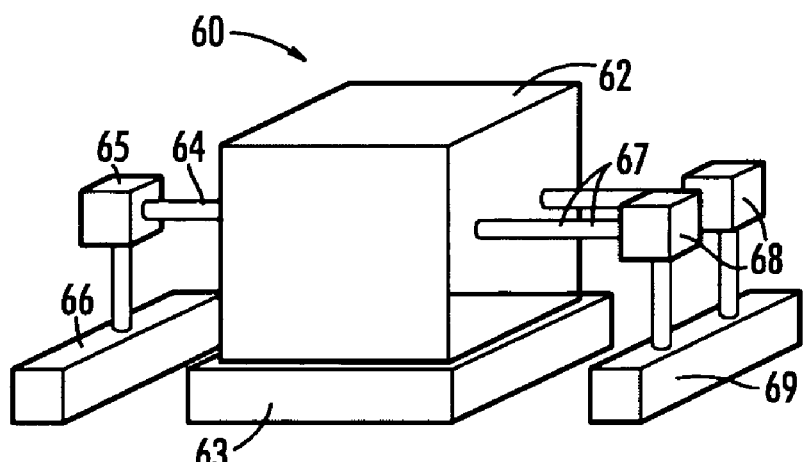
FIG. 6 is a partial cross-sectional view of an embodiment of the present invention.

Another embodiment is illustrated in perspective cutaway view in FIG. 6. In FIG. 6, the VMIEF, represented generally at 61, comprises a porous sintered anode core, 62, and cathodic pad, 63, as describe previously. One side the core has a lead, 64, and optional inductor, 65, with the lead in electrical contact with a primary pad, 66. The other side of the core has a multiplicity of leads, 67, illustrated as two leads, each with an optional inductor, 68. Each lead is in electrical contact with a primary pad, 69. In an alternate embodiment each lead may be in electrical contact with a distinct primary pad. The encasement is not illustrated.

The casing preferably encloses the entire VMEIF except for a sufficient portion of the primary pads and the secondary pad for mounting to a substrate. It is most preferred that the secondary pad and both primary pads be exposed on a common face.

The inductor is preferably comprises a ferrite material. The ferrite may contain metals or metal oxides without particular limit herein.

The porous sintered pellet is formed by pressing and sintering a high purity powder, or by way of etching a metal foil to provide an increased anode surface area.

The valve-metal is preferably selected from niobium, aluminum, tantalum, titanium, zirconium, hafnium, tungsten and alloys or combinations thereof. Aluminum, tantalum and niobium are most preferred. Aluminum is typically, but not exclusively, employed as a foil while tantalum is typically, but not exclusively, prepared by pressing tantalum powder and sintering to form a compact. For convenience in handling, the valve metal is typically attached to a carrier thereby allowing large numbers of elements to be processed at the same time.

The valve metal may be preferably etched to increase the surface area particularly if the valve metal is a foil such as aluminum foil. Etching is preferably done by immersing the valve metal into at least one etching bath. Various etching baths are taught in the art and the method used for etching the valve metal is not limited herein.

A dielectric is formed on the surface of the valve metal. It is most desirable, but not necessary, that the dielectric layer be an oxide of the valve metal. The oxide is preferably formed by dipping the valve metal into an electrolyte solution and applying a positive voltage to the valve metal. Electrolytes for the oxide formation can include, but are not limited to, ethylene glycol; polyethylene glycol dimethyl ether as described in U.S. Pat. No. 5,716,511; alkanolamines and phosphoric acid, as described in U.S. Pat. No. 6,480, 371; polar aprotic solvent solutions of phosphoric acid as described in U.K. Pat. No. GB 2,168,383 and U.S. Pat. No. 5,185,075; complexes of polar aprotic solvents with protonated amines as described in U.S. Pat. No. 4,812,951 or the like. Electrolytes for formation of the oxide on the valve metal including aqueous solutions of dicarboxylic acids, such as ammonium adipate are also known. Other materials may be incorporated into the oxide such as phosphates, citrates, etc. to impart thermal stability or chemical or hydration resistance to the oxide layer.

Coated on the surface of the dielectric layer is a conductive layer. The conductive layer acts as the cathode of the capacitive component. The conductive layer preferably, but not necessarily, comprises conductive polymer, such as polyethylenedioxythiophene (PEDT), polyaniline or polypyrrole or their derivatives; manganese dioxide, lead oxide or combinations thereof.

The solid cathode electrolyte is typically chosen from a very limited class of materials, to include manganese dioxide or electrically conductive organic materials such as 7,7',8,8'-tetracyanoquinonedimethane (TCNQ) complex salt, or intrinsically conductive polymers, such as polyaniline, polypyrol, polyethylenedioxythiophene, polythiophenes and their derivatives. The solid cathode electrolyte is applied so that it covers all dielectric surfaces. The conductive polymer cathodes are typically applied by either chemical oxidation polymerization, electrochemical oxidation polymerization or spray techniques with other less desirable techniques being reported.

The cathode layer can also comprise manganese dioxide. The manganese dioxide layer is preferably obtained by immersing an anode element in an aqueous manganese nitrate solution. The manganese oxide is then formed by thermally decomposing the nitrate at a temperature of from 200° to 350° C. in a dry or steam atmosphere. The anode may be treated multiple times to insure optimum coverage.

Particularly preferred conducting polymers comprise repeating units of Formula I, particularly in combination with organic sulfonates:

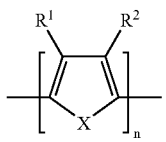

FORMULA 1 wherein $R^1$ and $R^2$ are chosen to prohibit polymerization at the beta-site of the ring particularly independently selected from alkyls or taken together to form an alkyl ring. X is S, Se or N.

A particularly preferred polymer is 3,4-polyethylene dioxythiophene (PEDT).

The polymer can be applied by any technique commonly employed in forming layers on a capacitor including dipping, spraying oxidizer dopant and monomer onto the pellet or foil, allowing the polymerization to occur for a set time, and ending the polymerization with a wash. The polymer can also be applied by electrolytic deposition as well known in the art.

The resin for the conductive layer is a polymer capable of forming secondary bonding with conductive particles. Preferred resins are polymers of materials selected from the group phenolic, phenoxy, epoxy, acrylic, cellulose derivatives, aromatic cyanate esters, diallyl isophthalate, bismaleimide, polyimides, polyamide imides, polysulfones, polyphylenes, polyether sulfones, polyaryl ethers, polyphenylene sulfides, polyarylene ether ketones, polyether imides, polyquinoxalines, polyquinolines, polybenzimidazoles, polybenzoxazoles, polybenzothiazoles, and silicones such as silicone polyester and silicone epoxy. More preferably the resin is selected from cellulose derivatives, acrylic, polyester, aromatic cyanate ester, epoxy, phenolic, diallyl isophthalate, phenoxy, polyimide and bismaleimide.

Adhesive layers preferably include: a carbon layer; a layer containing a highly conductive metal, typically silver, bound in a polymer or resin matrix; and a conductive adhesive layer such silver filled adhesive. The various layers connect the solid electrolyte to the outside circuit and also serve to protect the dielectric from thermo-mechanical damage that may occur during subsequent processing, board mounting, or customer use.

It is preferred that each layer be at least partially dried prior to coating of the subsequent layer thereon. Alternatively, the layers may be coated in a wet-on-wet fashion with adequate surface tension in each layer to prohibit substantial mixing of the layers. The layers can then be dried, or cured, simultaneously.

After the conductive cathode layer formation a carbon layer is preferably applied preferably by spraying or dipping.

The carbon layer serves as a chemical barrier between the solid electrolyte and the silver layer. Critical properties of the layer include adhesion to the underlying layer, wetting of the underlying layer, uniform coverage, penetration into the underlying layer, bulk conductivity, interfacial resistance, compatibility with the subsequent silver layer, buildup, and mechanical properties.

The carbon layer comprises a conductive composition comprising resin and conductive carbon particles. The carbon layer may also comprise adjuvants such as crosslinking additives, surfactants and dispersing agents. The resin, conductive carbon particles and adjuvants are preferably dispersed in an organic solvent or water to form a coating solution.

The carbon layer is preferably dispersed in an organic solvent. Preferably the organic solvent is present in an amount of 20–90 wt %. More particularly the organic solvent is present in an amount of 40–60 wt %. The organic solvent is preferable selected from glycol ethers, glycol ether ester, N-methylpyrrolidone, dimethyl formamide, xylene, etc. A particularly preferred solvent is glycol ether ester due to the good polymer solubility and high boiling point.

Carbon black is the most preferred as commercially available from various commercial sources such as Degussa, Cabot or Columbian Chemicals. The conductive particles have a preferred particle size range of 5 nm–30 microns. More preferably the conductive carbon black particles have a preferred particle size range of 10–200 nm.

It is preferable to include adjuvants to the carbon coating solution to facilitate wetability and leveling properties of the coating solution. Particularly preferred wetting agents include fluorinated surfactants such as those supplied by DuPont de Nemours under the trade name Zonyl, which are preferably added in an amount of up to 1 wt % of the coating solution.

A silver layer is preferably applied onto the carbon layer preferably by spraying or dipping.

The silver layer serves to conduct current from the cathodic layer to the cathode termination pad. The critical characteristics of this layer are high conductivity, adhesive strength to the carbon layer, wetting of the carbon layer, and the mechanical properties. Compatibility with the subsequent layers employed in the assembly and encapsulation of the capacitor are also critical. In capacitors which utilize solder to connect to the external lead solderability and thermal stability are important factors. In order for the solder to wet the silver layer, the resin in the silver must degrade below the temperature at which the solder is applied. However, excessive degradation of the resin creates an effect termed "silver leeching" resulting in a poor connection between the external cathode layers and the external cathode lead. The traditional approach to applying a silver layer requires a delicate compromise in thermal stability of the resin in order to simultaneously achieve solder wetting and to avoid silver leeching.

The silver layer comprises silver and a resin. It is most preferable that the silver layer be at least 5 µm thick. The silver composition of the silver layer is preferably 40 wt % to no more than about 95 wt % (dry basis). Below 40 wt % the conductivity is inadequate and above 95 wt % the adhesion is unacceptable. It is more preferred that the silver content of the silver layer be at least 85 wt % to no more than 95 wt %.

The VMEIF is finished by incorporating anode and cathode terminals, inductors and external insulators as known in the art. The resulting VMEIF may be any of leaded, surface mount or embedded configuration. In the case of surface mount VMEIF devices the silver adhesive is typically used to 'glue' the silver layer to the lead frame which serves as the cathode lead. For leaded devices solder is often used to attach a cathode lead to the silver layer.

The invention has been described with particular emphasis on the preferred embodiments. One of skill in the art would realize additional embodiments, alterations, and advances which, though not enumerated, are within the invention as set forth more specifically in the claims appended hereto.

The invention claimed is:

1. An electromagnetic interference filter comprising:
    a sintered porous valve metal pellet comprising at least two leads extending therefrom;

a dielectric layer at least partially circumventing said sintered porous valve metal pellet;

a conductive layer at least partially circumventing said dielectric layer;

a primary termination pads in electrical contact with each said lead;

an inductor in electrical contact with at least one lead of said leads between said sintered porous valve metal pellet and said primary termination pads;

a secondary termination pad in electrical contact with said conductive layer; and a casing enclosing at least one said electromagnetic interference filter except for a portion of said termination pads and said secondary termination pad.

2. The electromagnetic interference filter of claim 1 further comprising a second sintered porous valve metal pellet comprising at least one second lead extending therefrom;

a second dielectric layer at least partially circumventing said second sintered porous valve metal pellet; and a second conductive layer at least partially circumventing said second dielectric layer.

3. The electromagnetic interference filter of claim 2 wherein said sintered porous valve metal pellet and said second sintered porous valve metal pellet are fused.

4. The electromagnetic interference filter of claim 2 wherein one of said at least two leads extends into said second sintered porous valve metal pellet.

5. The electromagnetic interference filter of claim 2 wherein said inductor is between said sintered porous valve metal pellet and said second sintered porous valve metal pellet.

6. The electromagnetic interference filter of claim 1 further comprising a second inductor.

7. The electromagnetic interference filter of claim 6 wherein said inductor is in a first lead of said leads and said second inductor is in a second lead of said leads.

8. The electromagnetic interference filter of claim 1 wherein said inductor is a ferrite inductor.

9. The electromagnetic interference filter of claim 1 wherein said valve metal is selected from niobium, aluminum, tantalum, titanium, zirconium, hafnium, tungsten and alloys or combinations thereof.

10. The electromagnetic interference filter of claim 9 wherein said valve metal is selected from niobium, aluminium and tantalum.

11. The electromagnetic interference filter of claim 1 wherein said conductive layer comprises a polymer.

12. The electromagnetic interference filter of claim 11 wherein said polymer is selected from 7,7',8,8'-tetracyanoquinonedimethane, polyaniline, polypyrol, polyethylenedioxythiophene and polythiophenes.

13. The electromagnetic interference filter of claim 12 wherein said polymer is 3,4-polyethylene dioxythiophene.

14. The electromagnetic interference filter of claim 1 wherein said sintered valve metal pellet comprises at least two leads extending from a common face.

15. The electromagnetic interference filter of claim 14 wherein said at least two leads extending from a common face are in electrical contact with a common primary termination pad.

16. The electromagnetic interference filter of claim 1 wherein more than one electromagnetic filter element is connected in a series configuration.

17. The electromagnetic interference filter of claim 1 in which more than one electromagnetic filter element is contained within the assembly to comprise a multiple input/output filter.

18. An electronic circuit comprising the electromagnetic filter of claim 1.

19. An electromagnetic interference filter comprising:

a first sintered porous valve metal pellet comprising at least one first primary lead extending therefrom;

a first dielectric layer at least partially circumventing said first sintered porous valve metal pellet;

a first conductive layer at least partially circumventing said first dielectric layer;

a first primary termination pad in electrical contact with said first primary lead;

a first secondary termination pad in electrical contact with said first conductive layer;

a second sintered porous valve metal pellet comprising at least one second primary lead extending therefrom;

a second dielectric layer at least partially circumventing said second sintered porous valve metal pellet;

a second conductive layer at least partially circumventing said second dielectric layer;

a second primary termination pad in electrical contact with said second primary lead;

a second secondary termination pad in electrical contact with said second conductive layer;

electrical conductivity between said first sintered valve metal pellet and said second sintered valve metal pellet; and a casing enclosing at least one of said electromagnetic interference filter except for a portion of said first primary termination pad said second primary termination pad and said secondary termination pad.

20. The electromagnetic interference filter of claim 19 wherein said electrical conductivity between said first sintered valve metal pellet and said second sintered valve metal pellet comprises a common lead extending therebetween.

21. The electromagnetic interference filter of claim 20 wherein said common lead further comprises an inductor integral thereto.

22. The electromagnetic interference filter of claim 19 wherein said first sintered valve metal pellet and said second sintered valve metal pellet are fused.

23. The electromagnetic interference filter of claim 19 wherein said first secondary termination pad and said second secondary termination pad are a common secondary termination pad.

24. The electromagnetic interference filter of claim 19 further comprising an inductor.

25. The electromagnetic interference filter of claim 24 wherein said inductor is integral to said first primary lead.

26. The electromagnetic interference filter of claim 25 further comprising a second inductor integral to said second primary lead.

27. The electromagnetic interference filter of claim 24 wherein said inductor is a ferrite inductor.

28. The electromagnetic interference filter of claim 19 wherein said first sintered valve metal pellet comprises a valve metal selected from niobium, aluminum, tantalum, titanium, zirconium, hafnium, tungsten and alloys or combinations thereof.

29. The electromagnetic interference filter of claim 28 wherein said valve metal is selected from niobium, aluminium and tantalum.

30. The electromagnetic interference filter of claim 19 wherein said conductive layer comprises a polymer.

31. The electromagnetic interference filter of claim 30 wherein said polymer is selected from 7,7',8,8'-tetracyanoquinonedimethane, polyaniline, polypyrol, polyethylenedioxythiophene and polythiophenes.

32. The electromagnetic interference filter of claim 31 wherein said polymer is 3,4-polyethylene dioxythiophene.

33. The electromagnetic interference filter of claim 19 wherein said first sintered valve metal pellet comprises at least two leads extending from a common face.

34. The electromagnetic interference filter of claim 33 wherein said at least two leads extending from a common face are in electrical contact with a common primary termination pad.

35. The electromagnetic interference filter of claim 19 in which more than one electromagnetic filter element is connected in a series configuration.

36. The electromagnetic interference filter of claim 19 in which more than one electromagnetic filter element is contained within the assembly to comprise a multiple input/output filter.

37. An electronic circuit comprising the electromagnetic filter of claim 19.

* * * * *